United States Patent
Qu et al.

(10) Patent No.: US 11,761,118 B2
(45) Date of Patent: Sep. 19, 2023

(54) CARBON-DOPED SILICON SINGLE CRYSTAL WAFER AND METHOD FOR MANUFACTURING THE SAME

(71) Applicant: SHIN-ETSU HANDOTAI CO., LTD., Tokyo (JP)

(72) Inventors: Weifeng Qu, Takasaki (JP); Shizuo Igawa, Annaka (JP); Ken Sunakawa, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 121 days.

(21) Appl. No.: 17/619,516

(22) PCT Filed: Jun. 30, 2020

(86) PCT No.: PCT/JP2020/025694
§ 371 (c)(1),
(2) Date: Dec. 15, 2021

(87) PCT Pub. No.: WO2021/002363
PCT Pub. Date: Jan. 7, 2021

(65) Prior Publication Data
US 2022/0259767 A1      Aug. 18, 2022

(30) Foreign Application Priority Data
Jul. 2, 2019   (JP) ................. 2019-123917

(51) Int. Cl.
*B32B 9/00*      (2006.01)
*C30B 31/02*     (2006.01)
(Continued)

(52) U.S. Cl.
CPC .............. *C30B 31/02* (2013.01); *C30B 29/06* (2013.01); *C30B 33/02* (2013.01); *H01L 21/0201* (2013.01)

(58) Field of Classification Search
CPC ......... C30B 31/02; C30B 29/06; C30B 33/02; H01L 21/0201
(Continued)

(56) References Cited

U.S. PATENT DOCUMENTS

| 2009/0321747 A1 | 12/2009 | Murphy et al. |
| 2010/0224968 A1 | 9/2010 | Kurita |
| 2015/0354089 A1 | 12/2015 | Sonokawa et al. |

FOREIGN PATENT DOCUMENTS

| JP | 2009-038124 A | 2/2009 |
| JP | 2010-502023 A | 1/2010 |

(Continued)

OTHER PUBLICATIONS

Jun. 28, 2022 Office Action issued in Japanese Patent Application No. 2019-123917.
(Continued)

*Primary Examiner* — Daniel H Miller
(74) *Attorney, Agent, or Firm* — Oliff PLC

(57) ABSTRACT

A method for manufacturing a carbon-doped silicon single crystal wafer, including steps of: preparing a silicon single crystal wafer not doped with carbon; performing a first RTA treatment on the silicon single crystal wafer in an atmosphere containing compound gas; performing a second RTA treatment at a higher temperature than the first RTA treatment; cooling the silicon single crystal wafer after the second RTA treatment; and performing a third RTA treatment. The crystal wafer is modified to a carbon-doped silicon single crystal wafer, sequentially from a surface thereof: a 3C-SiC single crystal layer; a carbon precipitation layer; a diffusion layer of interstitial carbon and silicon; and a diffusion layer of vacancy and carbon. A carbon-doped silicon single crystal wafer having a surface layer with high carbon concentration and uniform carbon concentration dis-
(Continued)

tribution to enable wafer strength enhancement; and a method for manufacturing the carbon-doped silicon single crystal wafer.

17 Claims, 2 Drawing Sheets

(51) Int. Cl.
*C30B 29/06* (2006.01)
*C30B 33/02* (2006.01)
*H01L 21/02* (2006.01)

(58) Field of Classification Search
USPC .......................................................... 428/408
See application file for complete search history.

(56) References Cited

FOREIGN PATENT DOCUMENTS

| | | |
|---|---|---|
| JP | 2011-54656 A | 3/2011 |
| JP | 2011-096979 A | 5/2011 |
| JP | 2015-216327 A | 12/2015 |
| JP | 2018-190903 A | 11/2018 |
| WO | 2014/129123 A1 | 8/2014 |

OTHER PUBLICATIONS

Sep. 15, 2020 International Search Report issued in International Patent Application No. PCT/JP2020/025694.

Hara, Akita. et al. "Structural Elements of Ultrashallow Thermal Donors Formed in Silicon Crystals". Japanese Journal of Applied Physics,. vol. 49 (2010) pp. 050203-1-050203-3.

Dec. 28, 2021 International Search Report issued in International Patent Application No. PCT/JP2020/025694.

[FIG. 1]
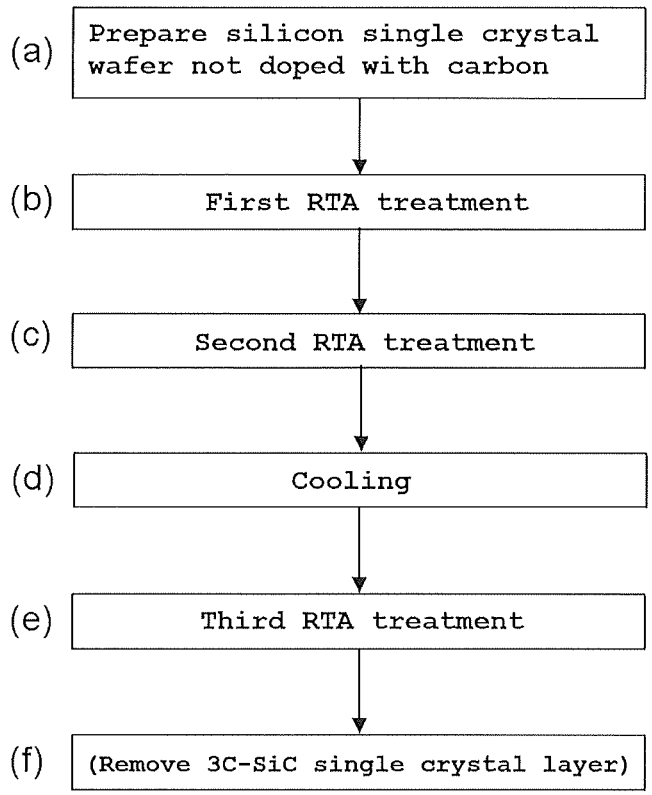
[FIG. 2]
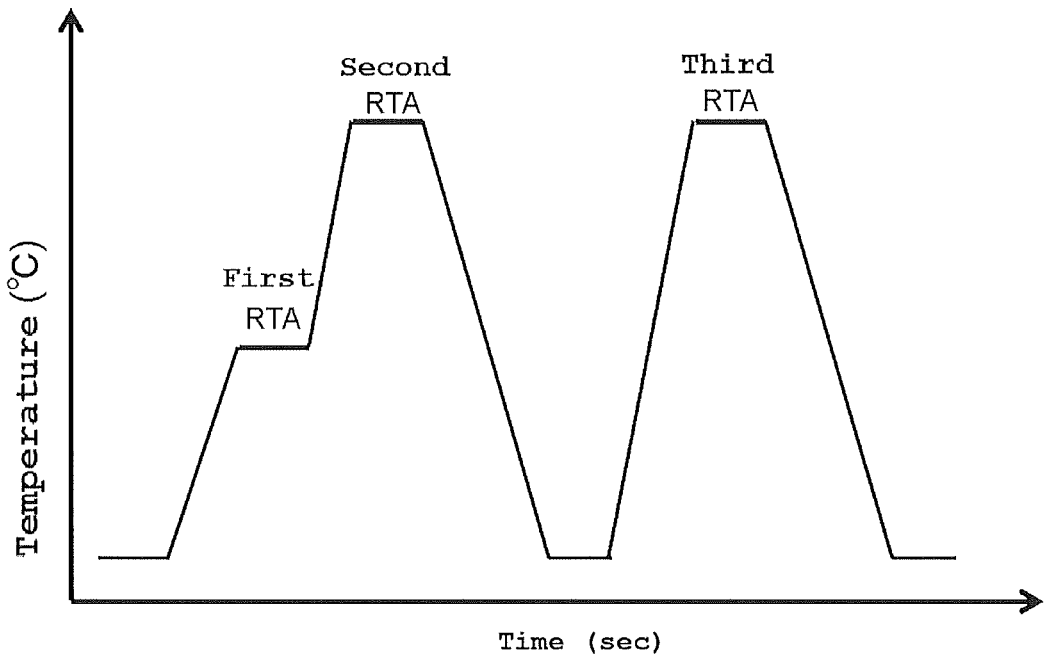

[FIG. 3]
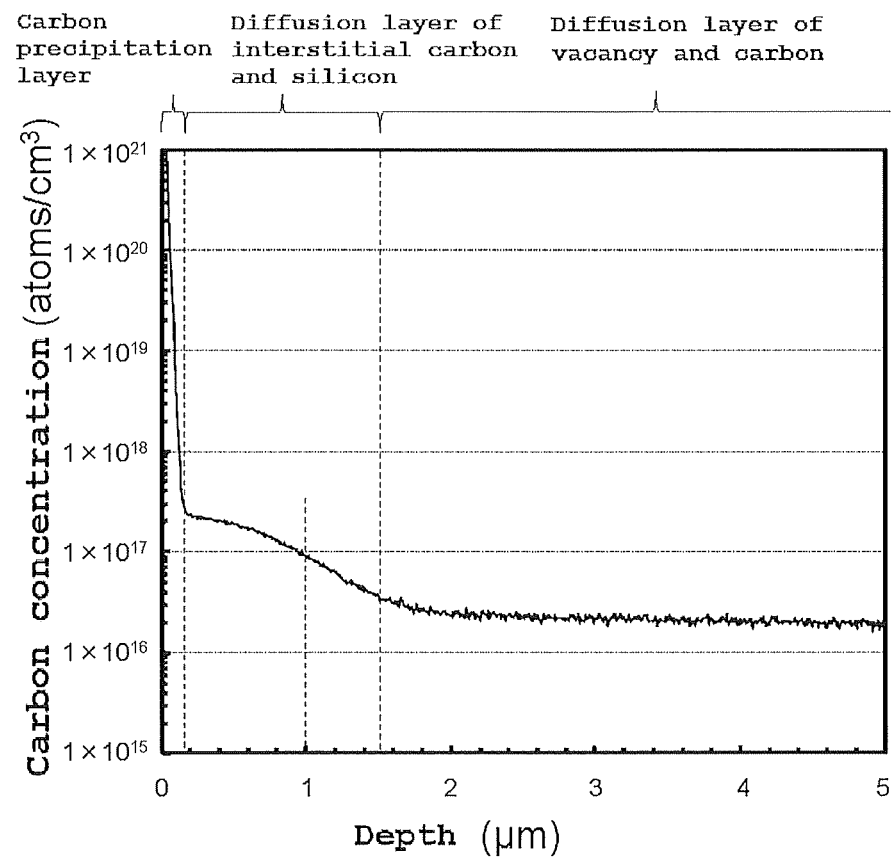
[FIG. 4]
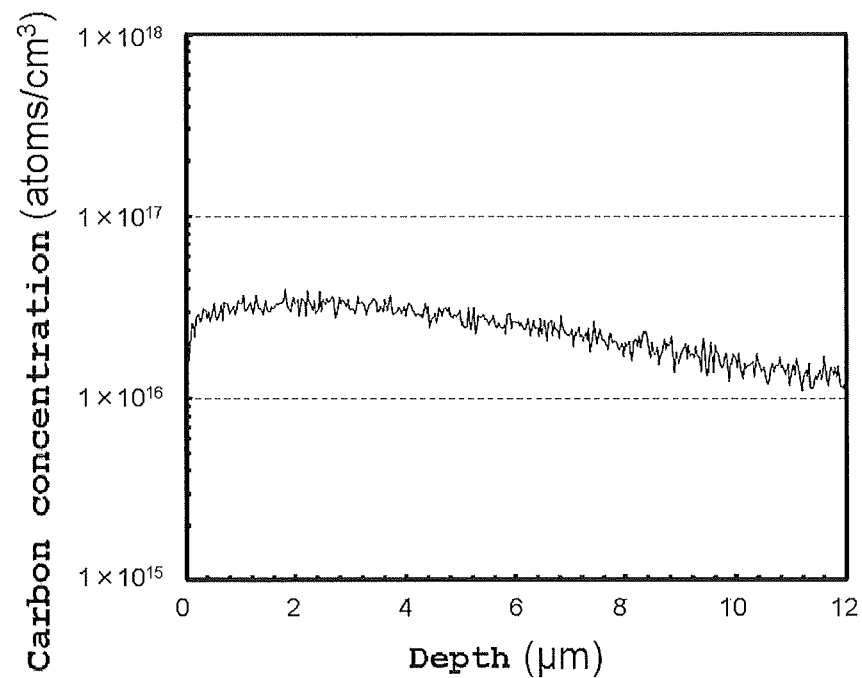

CARBON-DOPED SILICON SINGLE CRYSTAL WAFER AND METHOD FOR MANUFACTURING THE SAME

TECHNICAL FIELD

The present invention relates to a carbon-doped silicon single crystal wafer and a method for manufacturing the carbon-doped silicon single crystal wafer.

BACKGROUND ART

Silicon single crystal wafers are widely employed as substrates for manufacturing semiconductor devices. Meanwhile, for gettering metal impurities which enter as contaminants during the semiconductor-device manufacturing process, it is well known that silicon single crystal wafers are provided with gettering ability. By the way, cutting-edge devices have been manufactured under lower temperature conditions recently. Silicon single crystal wafers doped with carbon have been employed which promotes BMD (Bulk Micro Defects) formation by oxygen precipitation even in low temperature processes because the resultant serves as gettering sites of metal impurities in manufacturing processes.

Moreover, it is also well known that silicon single crystal wafers are doped with nitrogen or carbon to enhance the wafer strength. Nevertheless, the diffusion rate of nitrogen in a silicon single crystal is so fast that nitrogen diffuses outwardly in the nitrogen-doped silicon single crystal wafer during heating for device production, making it difficult to obtain high surface strength. On the other hand, since carbon has small diffusion coefficient, it is possible to enhance the surface strength of a carbon-doped silicon single crystal wafer.

Further, it is known that small dark current and excellent photosensitivity are achieved by a carbon-doped silicon single crystal wafer for solid state image sensor because carbon suppresses carrier injection from an electrode (see Non Patent Document 1).

Furthermore, it is well known that carbon in a silicon single crystal wafer also has an effect of suppressing formation of oxygen donor which would be generated during heat treatment (see Patent Document 1).

CITATION LIST

Patent Literature

Patent Document 1: JP 2011-54656 A
Patent Document 2: JP 2018-190903 A

Non Patent Literature

Non Patent Document 1: "Structural Elements of Ultrashallow Thermal Donors Formed in Silicon Crystals" A. Hara, T. Awano, Y. Ohno and I. Yonenaga: Jpn. J. Appl. Phys. 49 (2010) 050203.

SUMMARY OF INVENTION

Technical Problem

As methods for enhancing the wafer strength of silicon single crystal wafers, there have been known: doping a silicon single crystal wafer with carbon or nitrogen; forming a wafer from a crystal with high oxygen concentration; and precipitating oxides in a wafer. However, during the growth stage of a silicon single crystal (silicon single crystal ingot) by Czochralski method, when the crystal is doped with carbon or nitrogen, a segregation phenomenon occurs, so that the impurity concentration varies depending on the crystal position in the single crystal. Consequently, the amount of precipitated oxygen varies due to the difference in the crystal position.

In addition, there is a limit to control the amount of precipitated oxygen in a silicon single crystal wafer by manipulating the oxygen concentration alone. It is difficult to densely control the amount of precipitated oxygen without carbon- or nitrogen-doping.

Further, along with the aforementioned recent trend toward low-temperature device manufacturing process, less and less oxides are precipitated in a silicon single crystal wafer. Hence, there have been demands for a technology that can desirably control the amount of precipitated oxygen in such low-temperature device manufacturing processes.

Meanwhile, it has been propose to control BMD at high density by heating a silicon single crystal wafer in an atmosphere with a carbon-containing gas (see Patent Document 2). Nevertheless, since Patent Document 2 utilizes resistance heating for the heat treatment, carbon diffuses outwardly while the temperature is being lowered. Consequently, the carbon concentration in the wafer surface cannot be increased sufficiently, and the wafer strength is insufficient.

The present invention has been made in view of the above problems. An object of the present invention is to provide: a carbon-doped silicon single crystal wafer having a surface layer with high carbon concentration and uniform carbon concentration distribution to enable wafer strength enhancement; and a method for manufacturing the carbon-doped silicon single crystal wafer.

Solution to Problem

To achieve the object, the present invention provides a method for manufacturing a carbon-doped silicon single crystal wafer, the method comprising steps of:

preparing a silicon single crystal wafer not doped with carbon;

performing a first RTA treatment on the silicon single crystal wafer in an atmosphere containing a carbon atom-containing compound gas;

performing a second RTA treatment successively after the first RTA treatment at a higher temperature than that in the first RTA treatment;

cooling the silicon single crystal wafer after the second RTA treatment; and performing a third RTA treatment after the cooling, wherein the silicon single crystal wafer is modified by these steps to form a carbon-doped silicon single crystal wafer comprising, sequentially from a surface thereof:

a 3C-SiC single crystal layer;
a carbon precipitation layer;
a diffusion layer of interstitial carbon and silicon; and
a diffusion layer of vacancy and carbon.

According to such a method for manufacturing a carbon-doped silicon single crystal wafer, carbon atoms and vacancies are introduced together in the stage of RTA (Rapid Thermal Annealing) treatments involving rapid heating and rapid cooling. This makes it possible to increase the carbon diffusion coefficient by action of the vacancies without influence of the crystal position in the single crystal. This enables carbon atoms to uniformly diffuse from the surface, and to form a carbon-doped silicon single crystal wafer having, sequentially from the surface: a 3C-SiC single crystal layer; a carbon precipitation layer; a diffusion layer of interstitial carbon and silicon; and a diffusion layer of vacancy and carbon. Since a 3C-SiC single crystal layer is formed at the surface of the carbon-doped silicon single crystal wafer according to the present invention, this makes it easy to increase the carbon concentration of the carbon precipitation layer located under the 3C-SiC single crystal layer, and it is possible to provide a wafer having high strength.

Preferably, the inventive method for manufacturing a carbon-doped silicon single crystal wafer further comprises a step of removing the 3C-SiC single crystal layer by polishing after the step of performing the third RTA treatment.

By polishing to remove the 3C-SiC single crystal layer at the surface as described above, it is no longer necessary to remove the 3C-SiC single crystal layer during the device production.

Further, in this case, the carbon precipitation layer is preferably controlled to have a carbon concentration of $3 \times 10^{17}$ atoms/cm$^3$ or more within a range from the surface of the carbon-doped silicon single crystal wafer to 0.14 μm.

Controlling the carbon concentration at the surface portion of the wafer in this manner makes it possible to achieve higher wafer strength and desired amount of precipitated oxygen.

Additionally, the diffusion layer of interstitial carbon and silicon is preferably controlled to have a carbon concentration of $1 \times 10^{17}$ atoms/cm$^3$ or more within a range of more than 0.14 μm and 1 μm or less away from the surface of the carbon-doped silicon single crystal wafer.

Moreover, the diffusion layer of vacancy and carbon is preferably controlled to have a carbon concentration of $1 \times 10^{16}$ atoms/cm$^3$ or more in a region deeper than 1 μm from the surface of the carbon-doped silicon single crystal wafer.

Controlling the carbon concentrations at the bulk portion of the wafer as described above makes it possible to achieve higher wafer strength and desired amount of precipitated oxygen.

Further, in the inventive method for manufacturing a carbon-doped silicon single crystal wafer, the silicon single crystal wafer to be prepared preferably has an oxygen concentration of 11 ppma or more.

When such a wafer having an oxygen concentration of 11 ppma or more is prepared as described above, this further facilitates the oxygen precipitation in the carbon-doped silicon single crystal wafer. Note that oxygen concentrations expressed in the description of the present invention are measured according to JEITA.

Further, the silicon single crystal wafer to be prepared preferably comprises any of an Nv region, an Ni region, and a V region.

Since carbon is present in the silicon single crystal wafer manufactured according to the inventive method for manufacturing a carbon-doped silicon single crystal wafer, oxides can be precipitated and formed in any defect region. Besides, preparing a wafer having such defect regions as described above further facilitates the oxygen precipitation.

Further, the first and second RTA treatments are preferably performed in a mixed atmosphere containing a hydrocarbon gas and one or both of Ar and $H_2$.

Heating in such an atmosphere can more effectively introduce vacancies together with carbon.

More preferably, the first RTA treatment is performed at a temperature between 600° C. or more and 850° C. or less such that the temperature is maintained for a period of 5 seconds or more and 60 seconds or less, the second RTA treatment is performed at a temperature between 1100° C. or more and silicon melting point or less such that the temperature is maintained for a period of 10 seconds or more and 150 seconds or less, and the third RTA treatment is performed at a temperature between 1100° C. or more and silicon melting point or less such that the temperature is maintained for a period of 10 seconds or more and 150 seconds or less.

The RTA treatments under such conditions enable more effective introduction of both carbon and vacancy.

Further preferably, the third RTA treatment is repeated once or more times.

Repeating the third RTA treatment once or more times as described above enables vacancies and carbon atoms to diffuse more deeply from the surface. Thus, repeating the third RTA treatment can control the carbon concentration of the bulk portion to a desired value.

The present invention also provides a carbon-doped silicon single crystal wafer comprising, sequentially from a surface of the silicon single crystal wafer:

a carbon precipitation layer;

a diffusion layer of interstitial carbon and silicon; and a diffusion layer of vacancy and carbon.

Such a carbon-doped silicon single crystal wafer satisfactorily has high wafer strength.

Moreover, the carbon precipitation layer preferably has a carbon concentration of $3 \times 10^{17}$ atoms/cm$^3$ or more within a range from the surface of the carbon-doped silicon single crystal wafer to 0.14 μm.

Controlling the carbon concentration at the surface portion of the wafer in this manner makes it possible to achieve higher wafer strength and desired amount of precipitated oxygen.

Additionally, the diffusion layer of interstitial carbon and silicon preferably has a carbon concentration of $1 \times 10^{17}$ atoms/cm$^3$ or more within a range of more than 0.14 μm and 1 μm or less away from the surface of the carbon-doped silicon single crystal wafer.

Moreover, the diffusion layer of vacancy and carbon preferably has a carbon concentration of $1 \times 10^{16}$ atoms/cm$^3$ or more in a region deeper than 1 μm from the surface of the carbon-doped silicon single crystal wafer.

Controlling the carbon concentrations at the bulk portion of the wafer as described above makes it possible to achieve higher wafer strength and desired amount of precipitated oxygen.

In addition, the inventive carbon-doped silicon single crystal wafer may further comprise a 3C-SiC single crystal layer on the carbon precipitation layer.

The wafer as described above has, sequentially from the surface, a 3C-SiC single crystal layer, a carbon precipitation layer, a diffusion layer of interstitial carbon and silicon, and a diffusion layer of vacancy and carbon. The 3C-SiC single crystal layer in the wafer surface makes it easy to increase the carbon concentration of the carbon precipitation layer, and makes it possible to provide a wafer having quite high strength.

Further, the carbon-doped silicon single crystal wafer preferably has an oxygen concentration of 11 ppma or more.

Such an oxygen concentration further facilitates the oxygen precipitation in the carbon-doped silicon single crystal wafer.

Furthermore, the silicon single crystal wafer preferably comprises any of an Nv region, an Ni region, and a V region.

Having such defect regions in the wafer further facilitates the oxygen precipitation.

Advantageous Effects of Invention

According to the inventive method for manufacturing a carbon-doped silicon single crystal wafer, carbon atoms and vacancies are introduced together in the stage of the RTA treatments, and the carbon diffusion coefficient is successfully increased by action of the vacancies regardless of the crystal position in the single crystal. This enables the carbon atoms to uniformly diffuse from the surface, and to form a carbon-doped silicon single crystal wafer having, sequentially from the surface: a 3C-SiC single crystal layer; a carbon precipitation layer; a diffusion layer of interstitial carbon and silicon; and a diffusion layer of vacancy and carbon. As a result, the wafer has high strength. Since a 3C-SiC single crystal layer is formed at the surface of the carbon-doped silicon single crystal wafer, the present invention makes it possible to easily increase the carbon concentration of the carbon precipitation layer under the 3C-SiC single crystal layer, and to provide a wafer having high strength. Furthermore, the inventive carbon-doped silicon single crystal wafer satisfactorily has high wafer strength because the inventive wafer has a carbon precipitation layer, a diffusion layer of interstitial carbon and silicon, and a diffusion layer of vacancy and carbon in this order from the surface.

BRIEF DESCRIPTION OF DRAWINGS

FIG. 1 is a flowchart showing an example of a method for manufacturing a carbon-doped silicon single crystal wafer according to the present invention.

FIG. 2 is a graph showing an outline of a temperature profile of RTA treatments in the inventive method for manufacturing a carbon-doped silicon single crystal wafer.

FIG. 3 is a graph showing the SIMS measurement result of the carbon concentration distribution in a carbon-doped silicon single crystal wafer of Example.

FIG. 4 is a graph showing the SIMS measurement result of the carbon concentration distribution in a carbon-doped silicon single crystal wafer of Comparative Example.

DESCRIPTION OF EMBODIMENTS

As described above, along with the recent trend of low-temperature device manufacturing process, less and less oxides are precipitated in a silicon single crystal wafer. This brings about demands for a technology that can desirably control the amount of precipitated oxygen in such low-temperature device manufacturing processes. The present inventors have found that in order to enhance the wafer strength, a silicon single crystal wafer needs to be doped with carbon at high concentration. Moreover, the present inventors have found that when carbon atoms and vacancies are introduced together in heat-treatment stage, the vacancies serve to increase the carbon diffusion coefficient without influence of the crystal position in the single crystal, so that oxygen precipitation can be uniformly accelerated and grown. These findings have led to the completion of the present invention.

The present invention is a method for manufacturing a carbon-doped silicon single crystal wafer, the method comprising steps of:

preparing a silicon single crystal wafer not doped with carbon;

performing a first RTA treatment on the silicon single crystal wafer in an atmosphere containing a carbon atom-containing compound gas;

performing a second RTA treatment successively after the first RTA treatment at a higher temperature than that in the first RTA treatment;

cooling the silicon single crystal wafer after the second RTA treatment; and performing a third RTA treatment after the cooling, wherein the silicon single crystal wafer is modified by these steps to form a carbon-doped silicon single crystal wafer comprising, sequentially from a surface thereof:

a 3C-SiC single crystal layer;

a carbon precipitation layer;

a diffusion layer of interstitial carbon and silicon; and a diffusion layer of vacancy and carbon.

First, as shown in FIG. 1(a), a silicon single crystal wafer not doped with carbon is prepared (step a). Here, the silicon single crystal wafer to be prepared is preferably a silicon single crystal wafer prepared from a silicon single crystal ingot pulled according to a Czochralski method. In the present invention, "not doped with carbon" and similar phrases mean that no carbon is added to a silicon single crystal wafer intentionally. Thus, "silicon single crystal wafer not doped with carbon" includes a silicon single crystal wafer containing carbon as unintentional inevitable impurity.

The silicon single crystal wafer to be prepared here without being doped with carbon can be prepared as follows, for example. First, a silicon single crystal ingot is pulled according to Czochralski method (CZ method). Next, the silicon single crystal ingot is processed into a silicon single crystal wafer by known methods such as slicing, grinding, polishing, and etching (CW-processing).

Herein, the silicon single crystal wafer to be prepared preferably has an oxygen concentration of 11 ppma or more. This oxygen concentration can be attained by adjusting the pulling conditions. Moreover, the silicon single crystal wafer to be prepared here is preferably a silicon single crystal wafer composed of any of an Nv region, an Ni region, and a V region. Silicon single crystal wafers composed of these defect regions can be obtained by adjusting the pulling conditions, particularly pulling rate. The silicon single crystal wafer to be prepared may be a wafer in which the entire plane is an Nv region, a wafer in which the entire plane is an Ni region, a wafer in which the entire plane is a V region, or a wafer containing any combination of these regions. Note that, in silicon single crystals pulled according to Czochralski method, point defects (vacancy, interstitial silicon) are introduced during the crystal formation process. The silicon single crystals have: regions (V region, I region), where these defects agglomerate to form Grown-in defect; perfect crystal region (N region), where point defects do not agglomerate; etc. Moreover, although point defects do no agglomerate, an N region includes: Nv region, where vacancy is dominant; and Ni region, where interstitial silicon is dominant.

Next, as shown in FIG. 1(b), the silicon single crystal wafer not doped with carbon prepared as described above is subjected to a first RTA treatment in an atmosphere containing a carbon atom-containing compound gas (step b).

Next, as shown in FIG. 1(c), a second RTA treatment is performed successively after the first RTA treatment at a higher temperature than that in the first RTA treatment (step c).

The first and second RTA treatments are preferably performed in a mixed atmosphere containing a hydrocarbon gas and one or both of Ar and $H_2$. Heating in such an atmosphere can more effectively introduce vacancies together with carbon.

Next, as shown in FIG. 1(d), after the second RTA treatment is performed, the silicon single crystal wafer is cooled (step d). The temperature after the cooling may be the same as the temperature at which wafers are placed in or out in typical RTA processes. The cooling does not always have to be performed to room temperature. The temperature after the cooling can be, for example, 700° C. or less.

Next, as shown in FIG. 1(e), after the cooling is performed, a third RTA treatment is performed (step e). The atmosphere in this event is not limited to an atmosphere containing a carbon atom-containing compound gas, and may be Ar or $N_2$, for example. By this third RTA treatment, the carbon concentration at the bulk portion of the wafer is such that carbon can diffuse up to the solid solubility at the heating temperature in this event.

Additionally, the third RTA treatment may be repeated once or more times. In this case, after the third RTA treatment is performed once, cooling is performed, and the third RTA treatment is performed again. These operations may be repeated. Repeating the third RTA treatments enables vacancies and carbon atoms to diffuse more deeply from the surface. Thus, repeating the third RTA treatments can control the carbon concentration at the bulk portion to achieve desired value.

FIG. 2 shows an outline of a temperature profile of the RTA treatments including the first RTA treatment, the second RTA treatment, and the third RTA treatment. The first RTA treatment is performed preferably at a temperature between 600° C. or more and 850° C. or less, such that this temperature is maintained for a period of 5 seconds or more and 60 seconds or less. Thus, a hydrocarbon gas is attached to the entire surface of the silicon single crystal wafer without causing carbonization. Moreover, successively after the first RTA treatment, the second RTA treatment is performed preferably at a temperature between 1100° C. or more and silicon melting point or less, such that this temperature is maintained for a period of 10 seconds or more and 150 seconds or less. Thus, the carbon attached to the surface of the silicon single crystal wafer forms a 3C-SiC single crystal layer. Further, after the cooling, the third RTA treatment is performed preferably at a temperature between 1100° C. or more and silicon melting point or less, such that this temperature is maintained for a period of 10 seconds or more and 150 seconds or less. Thus, vacancy and carbon are diffused inwardly. Under such RTA treatment conditions, vacancies together with carbon can be introduced more effectively.

The first RTA treatment (step b), second RTA treatment (step c), and third RTA treatment (step e) introduce vacancies into the silicon single crystal wafer and enable doping with carbon. Moreover, according to the present invention, carbon and vacancies are introduced together in the stage of the RTA treatments, so that the carbon diffusion coefficient is successfully increased by action of the vacancies regardless of the crystal position in the single crystal. As a result, the carbons are allowed to uniformly diffuse through the surface, and to modify the silicon single crystal wafer to form a carbon-doped silicon single crystal wafer having, sequentially from the surface thereof: a 3C-SiC single crystal layer; a carbon precipitation layer; a diffusion layer of interstitial carbon and silicon; and a diffusion layer of vacancy and carbon. Since a 3C-SiC single crystal layer is formed at the surface of the carbon-doped silicon single crystal wafer, the present invention makes it possible to easily increase the carbon concentration at the surface, and to provide a wafer having high strength.

Additionally, the inventive method for manufacturing a carbon-doped silicon single crystal wafer can further include a step of removing the 3C-SiC single crystal layer by polishing (step f) after the step of performing the third RTA treatment (step e).

As described above, since a 3C-SiC single crystal layer is formed by the first, second, and third RTA treatments, it is preferable to remove this layer. Although this step is an optional step, removing the 3C-SiC single crystal layer formed at the surface eliminates the need to remove the 3C-SiC single crystal layer again during the device production.

After the 3C-SiC single crystal layer is removed, the carbon precipitation layer is preferably controlled to have a carbon concentration of $3 \times 10^{17}$ atoms/cm$^3$ or more within a range from the surface of the carbon-doped silicon single crystal wafer to 0.14 μm. Thereby, higher wafer strength can be achieved.

Moreover, after the 3C-SiC single crystal layer is removed, the diffusion layer of interstitial carbon and silicon is preferably controlled to have a carbon concentration of $1 \times 10^{17}$ atoms/cm$^3$ or more within a range of more than 0.14 μm and 1 μm or less away from the surface of the carbon-doped silicon single crystal wafer. Further, after the 3C-SiC single crystal layer is removed, the diffusion layer of vacancy and carbon is preferably controlled to have a carbon concentration of $1 \times 10^{16}$ atoms/cm$^3$ or more in a region deeper than 1 μm from the surface of the carbon-doped silicon single crystal wafer.

Such carbon distributions can be arranged by controlling the carbon concentration distribution in a wafer thickness direction because the diamond structure of silicon single crystal has many gaps and allows impurities to diffuse therethrough readily. Particularly, in a vacancy dominant state, the vacancies allow carbon to diffuse quite readily. Accordingly, first, by the first RTA, carbon is uniformly attached to the surface of the silicon single crystal wafer. Particularly, when the first RTA treatment is performed at 600° C. or more, carbon is readily attached to the wafer surface. When the first RTA treatment is performed at 850° C. or less, this makes it possible to prevent carbonization of the wafer surface in the first RTA treatment stage, and facilitates the formation of a 3C-SiC single crystal layer in the subsequent second RTA. In this subsequent second RTA, the 3C-SiC single crystal layer is formed on the surface. To form a 3C-SiC single crystal layer in the second RTA, heating is performed preferably at a temperature between 1100° C. or more and silicon melting point or less as described above. An atmospheric gas in this event preferably has a carbon atom concentration of 0.1% or more. In addition, when atmospheric gases in the first and second RTA treatments are a mixed atmosphere containing a hydrocarbon gas and one or both of Ar and $H_2$ as described above, a silicon-carbide single crystal film (3C-SiC single crystal layer) is readily formed at the wafer surface.

A carbon-doped silicon single crystal wafer manufactured according to the inventive method for manufacturing a carbon-doped silicon single crystal wafer as described above has, sequentially from the surface; a 3C-SiC single crystal layer; a carbon precipitation layer; a diffusion layer of interstitial carbon and silicon; and a diffusion layer of vacancy and carbon. Moreover, removing the 3C-SiC single crystal layer from this carbon-doped silicon single crystal wafer enables the carbon-doped silicon single crystal wafer to have, sequentially from the surface thereof: a carbon precipitation layer; a diffusion layer of interstitial carbon and silicon; and a diffusion layer of vacancy and carbon. Note that each of the 3C-SiC single crystal layer, the carbon precipitation layer, the diffusion layer of interstitial carbon and silicon, and the diffusion layer of vacancy and carbon can be identified through SIMS or TEM (transmission electron microscope).

In this case, the carbon precipitation layer is preferably controlled to have a carbon concentration of $3\times10^{17}$ atoms/cm$^3$ or more within a range from the surface of the carbon-doped silicon single crystal wafer to 0.14 μm. Moreover, the diffusion layer of interstitial carbon and silicon is preferably controlled to have a carbon concentration of $1\times10^{17}$ atoms/cm$^3$ or more within a range of more than 0.14 μm and 1 μm or less away from the surface of the carbon-doped silicon single crystal wafer. Further, the diffusion layer of vacancy and carbon is preferably controlled to have a carbon concentration of $1\times10^{16}$ atoms/cm$^3$ or more in a region deeper than 1 μm from the surface of the carbon-doped silicon single crystal wafer.

Note that, in the present invention, the carbon-doped silicon single crystal wafer essentially has a carbon precipitation layer, a diffusion layer of interstitial carbon and silicon, and a diffusion layer of vacancy and carbon in this order from the surface. The carbon concentration of the carbon precipitation layer desirably satisfies the carbon concentration of $3\times10^{17}$ atoms/cm$^3$ or more within the range from the surface to 0.14 μm. Nevertheless, the carbon precipitation layer does not necessarily have to constitute the entire range from the surface to 0.14 μm thoroughly by itself. For example, the carbon precipitation layer itself may be located within a range from the surface to 0.1 μm. In this case, the carbon concentration of $3\times10^{17}$ atoms/cm$^3$ or more is preferably satisfied by the entire carbon precipitation layer in this region.

Likewise, the diffusion layer of interstitial carbon and silicon does not necessarily have to be located within the range of more than 0.14 μm and 1 μm or less away from the surface, but should be present deeper inside the wafer than the carbon precipitation layer. For example, the diffusion layer of interstitial carbon and silicon itself may be present within a range of more than 0.1 μm and 1.5 μm or less away from the wafer surface. In this case, the carbon concentration of $1\times10^{17}$ atoms/cm$^3$ or more is preferably satisfied by a portion of the diffusion layer of interstitial carbon and silicon located within the range of more than 0.14 μm and 1 μm or less away from the surface. Further, the diffusion layer of vacancy and carbon should be present deeper inside the wafer than the diffusion layer of interstitial carbon and silicon, and does not necessarily have to be located in the region deeper than 1 μm away from the surface. For example, the diffusion layer of vacancy and carbon may be present in a range deeper than 1.5 μm away from the surface. In this case, the carbon concentration of $1\times10^{16}$ atoms/cm$^3$ or more is preferably satisfied by the diffusion layer of vacancy and carbon in this region.

Furthermore, the carbon-doped silicon single crystal wafer preferably has an oxygen concentration of 11 ppma or more, and preferably composed of any of an Nv region, an Ni region, and a V region.

EXAMPLE

Hereinafter, the present invention will be specifically described with reference to Example and Comparative Example, but the present invention is not limited to these examples.

Example

First, a silicon single crystal ingot was pulled according to Czochralski method, and a wafer was processed therefrom. Thus, as a silicon single crystal wafer not doped with carbon, a silicon single crystal wafer was prepared (step a) which had a diameter of 200 mm, crystal plane orientation (100), P type, normal resistance, oxygen concentration of 12 ppma (JEITA), carbon concentration of less than $2.5\times10^{15}$ atoms/cm$^3$, and Nv region as defect region.

Next, the first, second, and third RTA treatments were performed as follows.

After the silicon single crystal wafer was put in an RTA treatment apparatus, the temperature was raised from room temperature to 800° C. Then, the temperature was maintained at 800° C. for 20 seconds (step b, first RTA). In this event, the atmosphere was CH$_4$+H$_2$/Ar with 2% carbon concentration.

Next, the temperature was raised to 1200° C., and maintained at 1200° C. for 10 seconds (step c, second RTA). In this event, the atmosphere was CH$_4$+H$_2$/Ar with 2% carbon concentration, and the same atmosphere as that in the first RTA was continuously used. Thereafter, the temperature was lowered to room temperature.

Next, after the cooling (step d), the third RTA treatment (step e) was performed. In this third RTA treatment, the conditions were the same as those in the second RTA treatment.

Next, a 3C-SiC single crystal film (approximately 7 nm) formed on the surface of the silicon single crystal wafer was removed (step f). In this event, polishing was performed to surely remove the 3C-SiC single crystal film by setting a target removal stock of 0.1 μm.

Finally, SIMS (secondary ion mass spectrometry) was employed to measure the depth distribution of the carbon concentration in the carbon-doped silicon single crystal wafer thus manufactured. FIG. 3 shows the result. A carbon precipitation layer was formed at the surface of the carbon-doped silicon single crystal wafer. The carbon concentration within the range from the surface to 0.14 μm was $3\times10^{17}$ atoms/cm$^3$ or more, and particularly the carbon concentration at the surface section was $1\times10^{21}$ atoms/cm$^3$. Moreover, in the wafer, a diffusion layer of interstitial carbon and silicon was formed deeper than the carbon precipitation layer. This diffusion layer was formed within a range of more than 0.14 μm and 1.5 μm or less away from the surface. Additionally, of the diffusion layer, a portion located within the range of more than 0.14 μm and 1 μm or less away from the surface had a carbon concentration of $1\times10^{17}$ atoms/cm$^3$ or more. Further, a diffusion layer of vacancy and carbon was formed deeper inside the wafer than the diffusion layer of interstitial carbon and silicon. This diffusion layer of vacancy and carbon was formed in a range that was deeper than 1.5 μm from the surface. The diffusion layer of vacancy and carbon had a carbon concentration of about $3\times10^{16}$ atoms/cm$^3$, that is, $1\times10^{16}$ atoms/cm$^3$ or more. This concentration is equivalent to the solid solubility of carbon at 1200°

C. Note that the detection lower limit of the carbon concentration by SIMS is approximately $7\times10^{15}$ atoms/cm$^3$.

Comparative Example

First, as in Example, a silicon single crystal wafer as a silicon single crystal wafer not doped with carbon was prepared which had a diameter of 200 mm, crystal plane orientation (100), P type, normal resistance, oxygen concentration of 12 ppma (JEITA), carbon concentration of less than $2.5\times10^{15}$ atoms/cm$^3$, and Nv region as defect region.

Next, a vertical heat treatment furnace was used for carbon-doping heat treatment. First, the prepared wafer was put in the vertical heat treatment furnace at 750° C. Then, the temperature was raised to 1000° C. at a rate of 10° C./rain. Subsequently, the temperature was raised from 1000° C. to 1200° C. at a rate of 3° C./min, maintained at 1200° C. for 60 minutes, and lowered at a rate of −3° C./min. Thereafter, the wafer was taken out from the vertical heat treatment furnace at 700° C. The gas atmosphere throughout the heat treatment process was $CO_2$+Ar with carbon concentration of 1%.

Finally, an oxide film on the surface of the heated wafer was removed, and the carbon profile was evaluated by SIMS. FIG. 4 shows the result. The carbon concentration within a range from the wafer surface to a depth of 0.1 μm was $2\times10^{16}$ atoms/cm$^3$, and the carbon concentration at a depth of around 2 μm was $3\times10^{16}$ atoms/cm$^3$, which is equivalent to the solid solubility. It was found that the carbon concentration was lowered in the bulk direction.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A method for manufacturing a carbon-doped silicon single crystal wafer, the method comprising steps of:
    preparing a silicon single crystal wafer not doped with carbon;
    performing a first RTA treatment on the silicon single crystal wafer in an atmosphere containing a carbon atom-containing compound gas;
    performing a second RTA treatment successively after the first RTA treatment at a higher temperature than that in the first RTA treatment;
    cooling the silicon single crystal wafer after the second RTA treatment; and
    performing a third RTA treatment after the cooling, wherein
    the silicon single crystal wafer is modified by these steps to form a carbon-doped silicon single crystal wafer comprising, sequentially from a surface thereof:
    a 3C-SiC single crystal layer;
    a carbon precipitation layer;
    a diffusion layer of interstitial carbon and silicon; and
    a diffusion layer of vacancy and carbon.

2. The method for manufacturing a carbon-doped silicon single crystal wafer according to claim 1, further comprising a step of removing the 3C-SiC single crystal layer by polishing after the step of performing the third RTA treatment.

3. The method for manufacturing a carbon-doped silicon single crystal wafer according to claim 2, wherein the carbon precipitation layer is controlled to have a carbon concentration of $3\times10^{17}$ atoms/cm$^3$ or more within a range from the surface of the carbon-doped silicon single crystal wafer to 0.14 μm.

4. The method for manufacturing a carbon-doped silicon single crystal wafer according to claim 2, wherein the diffusion layer of interstitial carbon and silicon is controlled to have a carbon concentration of $1\times10^{17}$ atoms/cm$^3$ or more within a range of more than 0.14 μm and 1 μm or less away from the surface of the carbon-doped silicon single crystal wafer.

5. The method for manufacturing a carbon-doped silicon single crystal wafer according to claim 2, wherein the diffusion layer of vacancy and carbon is controlled to have a carbon concentration of $1\times10^{16}$ atoms/cm$^3$ or more in a region deeper than 1 μm from the surface of the carbon-doped silicon single crystal wafer.

6. The method for manufacturing a carbon-doped silicon single crystal wafer according to claim 1, wherein the silicon single crystal wafer to be prepared has an oxygen concentration of 11 ppma or more.

7. The method for manufacturing a carbon-doped silicon single crystal wafer according to claim 1, wherein the silicon single crystal wafer to be prepared comprises any of an Nv region, an Ni region, and a V region.

8. The method for manufacturing a carbon-doped silicon single crystal wafer according to claim 1, wherein the first and second RTA treatments are performed in a mixed atmosphere containing a hydrocarbon gas and one or both of Ar and $H_2$.

9. The method for manufacturing a carbon-doped silicon single crystal wafer according to claim 1, wherein
    the first RTA treatment is performed at a temperature between 600° C. or more and 850° C. or less such that the temperature is maintained for a period of 5 seconds or more and 60 seconds or less,
    the second RTA treatment is performed at a temperature between 1100° C. or more and silicon melting point or less such that the temperature is maintained for a period of 10 seconds or more and 150 seconds or less, and
    the third RTA treatment is performed at a temperature between 1100° C. or more and silicon melting point or less such that the temperature is maintained for a period of 10 seconds or more and 150 seconds or less.

10. The method for manufacturing a carbon-doped silicon single crystal wafer according to claim 1, wherein the third RTA treatment is repeated once or more times.

11. A carbon-doped silicon single crystal wafer comprising, sequentially from a surface of the silicon single crystal wafer:
    a carbon precipitation layer;
    a diffusion layer of interstitial carbon and silicon; and
    a diffusion layer of vacancy and carbon.

12. The carbon-doped silicon single crystal wafer according to claim 11, wherein the carbon precipitation layer has a carbon concentration of $3\times10^{17}$ atoms/cm$^3$ or more within a range from the surface of the carbon-doped silicon single crystal wafer to 0.14 μm.

13. The carbon-doped silicon single crystal wafer according to claim 11, wherein the diffusion layer of interstitial carbon and silicon has a carbon concentration of $1\times10^{17}$ atoms/cm$^3$ or more within a range of more than 0.14 μm and 1 μm or less away from the surface of the carbon-doped silicon single crystal wafer.

14. The carbon-doped silicon single crystal wafer according to claim 11, wherein the diffusion layer of vacancy and carbon has a carbon concentration of $1\times10^{16}$ atoms/cm$^2$ or more in a region deeper than 1 μm from the surface of the carbon-doped silicon single crystal wafer.

15. The carbon-doped silicon single crystal wafer according to claim 11, further comprising a 3C-SiC single crystal layer on the carbon precipitation layer.

16. The carbon-doped silicon single crystal wafer according to claim 11, wherein the carbon-doped silicon single crystal wafer has an oxygen concentration of 11 ppma or more.

17. The carbon-doped silicon single crystal wafer according to claim 11, wherein the silicon single crystal wafer comprises any of an Nv region, an Ni region, and a V region.

* * * * *